United States Patent [19]

Kneip, Jr.

[11] Patent Number: 4,757,261
[45] Date of Patent: Jul. 12, 1988

[54] MAGNETIC FIELD HOMOGENEITY

[75] Inventor: George D. Kneip, Jr., Menlo Park, Calif.

[73] Assignee: Varian Associates, Inc., Palo Alto, Calif.

[21] Appl. No.: 44,940

[22] Filed: Apr. 30, 1987

[51] Int. Cl.[4] .......................................... G01R 33/20
[52] U.S. Cl. .......................................... 324/319; 62/50
[58] Field of Search .............. 62/50, 514 R; 324/300, 324/309, 318, 319, 320, 322

[56] References Cited

U.S. PATENT DOCUMENTS

| 3,827,246 | 8/1974 | Moen et al. | 62/50 |
| 3,864,928 | 2/1975 | Eigenbrod | 62/50 |
| 3,878,691 | 4/1975 | Asztalos | 62/50 |
| 4,652,824 | 3/1987 | Oppelt | 324/319 |

Primary Examiner—Michael J. Tokar
Attorney, Agent, or Firm—Stanley Z. Cole; Gerald M. Fisher; Edward H. Berkowitz

[57] ABSTRACT

An NMR instrument incorporating a cryogenic magnet includes a constant pressure device to maintain the pressure of cryogenic vapors at a constant value whereby a stable magnetic environment is maintained.

4 Claims, 2 Drawing Sheets

MAGNETIC FIELD HOMOGENEITY

FIELD OF THE INVENTION

The present invention is in the field of NMR and particularly rates to stability of performance for a cryogenically-cooled NMR instrument.

BACKGROUND OF THE INVENTION

The practice of high resolution NMR has been largely facilitated by progress toward higher magnetic fields. Stable high field instruments are commonly characterized by superconducting magnets. Such a magnet is housed in a cryostat carefully designed to achieve the greatest thermal isolation for a central (liquid helium) cryogen reservoir from ambient temperature. Thermal efficiency of modern cryostats is such that 40 liters of liquid helium may require of the order of 90 days to completely boil away. The cryogen reservoir is necessarily slightly above atmospheric pressure due to the boiling cryogen. Communicating passages from the cryogen reservoir to ambient environment vent the boiling cryogen to atmosphere. Great care must be taken in the design of the venting arrangements to assure that these conduits do not become clogged from condensates.

Notwithstanding the inherent stability of superconducting magnets, other essential elements of the apparatus affect stability and reproducibility. The magnetic field in a typical commercial instrument is capable of exhibiting uniformity to 8th order in the axial coordinate Z, through a combination of both superconducting and room temperature shim coils whereby undesired magnetic field gradients are compensated.

In the present invention, certain environmental instability in NMR apparatus has been remedied. It has been found that high resolution NMR apparatus employing cryogenically-cooled magnets exhibits a drift in lineshape response akin to what would be expected for an unstable gradient power supply. Such instabilities in a gradient power supply(ies) are found to be too small to account for the observed effects. Instead, such observed effects correlate with ambient pressure dependence. In a preferred embodiment, the fill and vent conduits leading to the central cryogen reservoir of the magnet cryostat are adapted to communicate with atmospheric pressure through a constant pressure valve whereby the pressure in the cryogen reservoir is maintained at a selected value independent of barometric variation.

DETAILED DESCRIPTION OF THE INVENTION

Figure 3B:
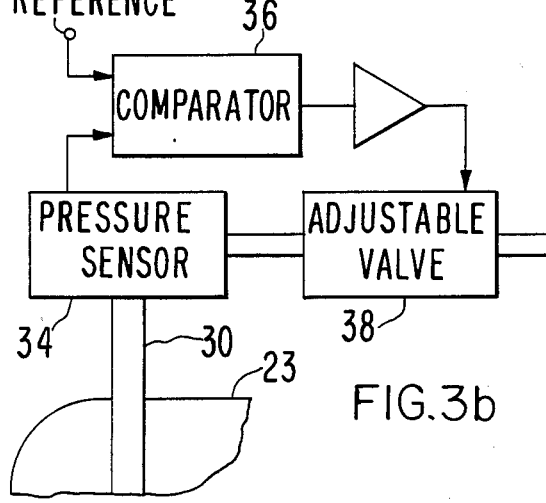
FIG. 3b is another embodiment of the invention.

Portions of a typical NMR data acquisition instrument are schematically illustrated on FIG. 3. An acquisition/control processor 10 communicates with an RF transmitter 12, modulator 14 and receiver 16, including analog-to-digital converter 18 and a further processor 20. The modulated RF power radiates an object (not shown) in a magnetic field 21 through a probe assembly 22 and the response to the object is intercepted by probe 22 communicating with receiver 16. The response typically takes the form of a transient oscillatory signal, often referred to as the time domain waveform. This transient waveform is sampled at regular intervals and samples are digitized in ADC 18. The digitized time domain waveform is then subject to further processing in processor 20. The nature of such processing may include averaging a time domain waveform with a number of similar such waveforms, and transformation of the average time domain waveform to the frequency domain yields a spectral distribution function directed to output device 24. The latter may take on any of a number of identities for the display of further analysis and data.

Figure 1:
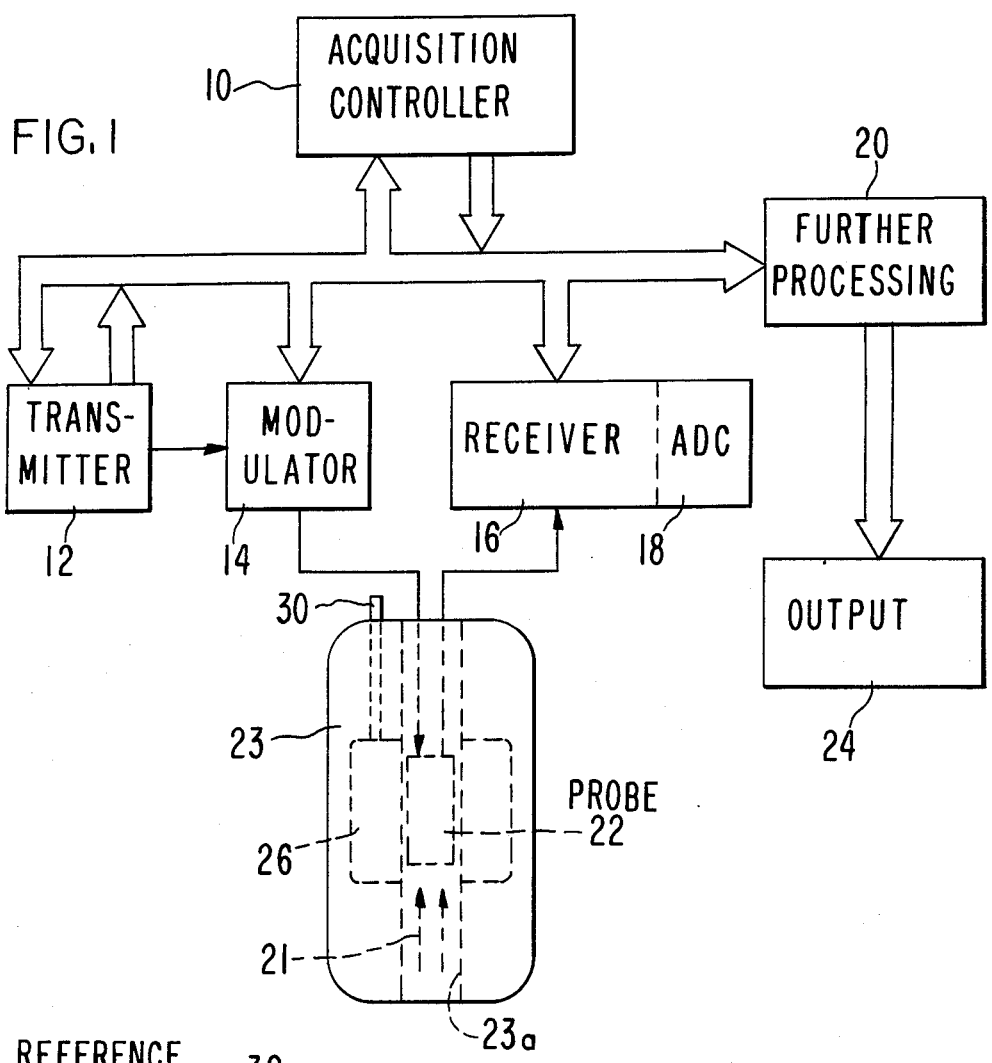
FIG. 1 shows the instrumental context of a typical NMR apparatus.

The magnetic field 21 which polarizes the sample is established by an appropriate means indicated in FIG. 1 as a cryostat 23 for maintaining a superconducting phase in a solenoid, not shown. The cryostat comprises a bore 23a in which the probe and sample are housed at room temperature and a cryogen reservoir 26 in which the solenoid is mounted. The boiling cryogen evolved in reservoir 26 is vented to atmosphere through vent tube 30.

Turning now to FIGS. 2, the effect in question is shown as a set of spectra obtained for an isolated spectral line (chloraform) acquired on a 500 MHz (11.7 Tesla) instrument. In FIG. 2a, there is shown the line shape obtained under standard operating conditions with the helium reservoir at approximately 0.1 psi above atmospheric pressure. The line width is approximately 0.5 $H_z$. This slight pressure is then relieved to atmospheric pressure and the data acquisition is repeated (FIG. 2b). This spectrum was reproduced at 10 minute intervals with no further significant difference in line shape. Upon restoration of the pressure differential of 0.1 psi and allowing a time interval for pressure recovery to steady state, FIG. 2d indicates restoration of the original line shape of FIG. 2a. FIG. 2c was obtained during the approach to steady state. This set of experiments was found to be reproducible in cryostats of diverse geometry.

It is conjectured that pressure dependence affects both the magnetic field shape as well as the net field. The magnetic susceptibility of helium is believed to be one cause of the effect. As the pressure is decreased, the temperature and susceptibility of the helium liquid and vapor is altered. The magnetic environment for the magnetic field 21 is therefor affected and the magnetic field distribution distorted.

Another cause is the mechanical deformation of the cryostat and especially the differential mechanical deformation of the several components. The cryostat typically exhibits a nested structure of cryogen reservoir(s) and heat shields forming isothermal shells at distinct temperatures. Consequently, the mechanical linkages for retaining these nested structures in a desired relationship must also be characterized by a high degree of thermal isolation. This is achieved at the expense of mechanical rigidity.

Another aspect of this mechanical relationship is the disposition of the main (superconducting) solenoid within the innermost reservoir structure of the cryostat with respect to room temperature shim coils mounted in the bore 23a of the cryostat. It is possible that relative displacement of the main solenoid structure with respect to the shim coil structure contributes to the observed effect.

Figure 3A:
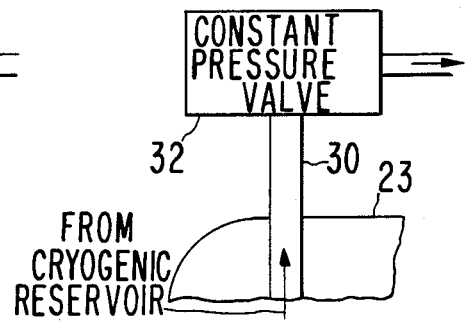
FIG. 3a is a schematic illustration of the preferred embodiment of the invention.
Figure 2A:
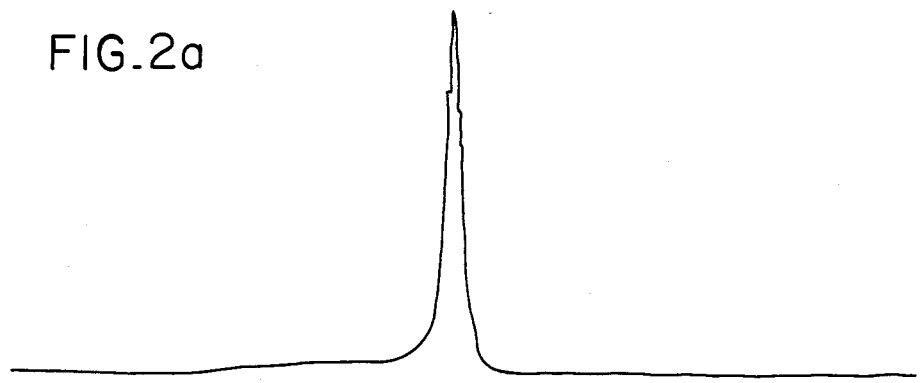
FIGS. 2a-2d illustrates the effect of a pressure variation.
Figure 2B:
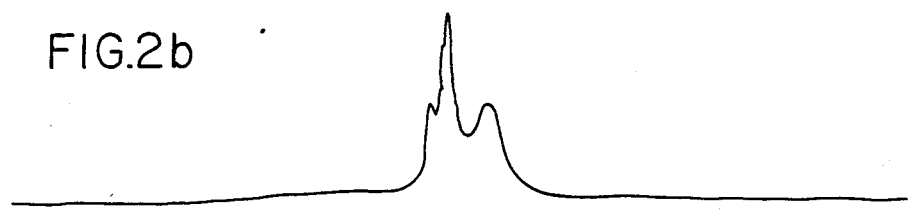
Figure 2C:
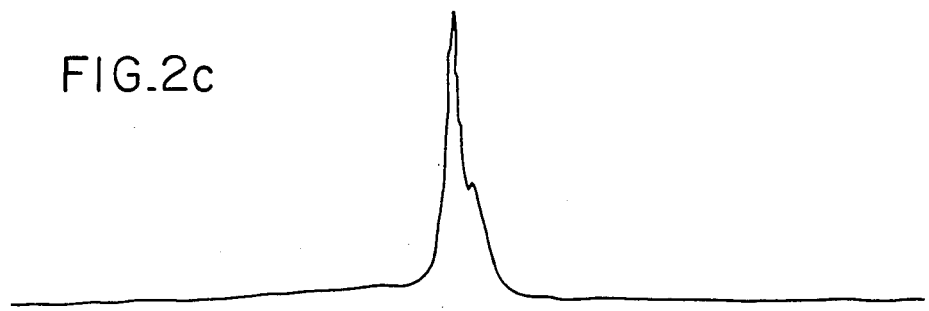
Figure 2D:
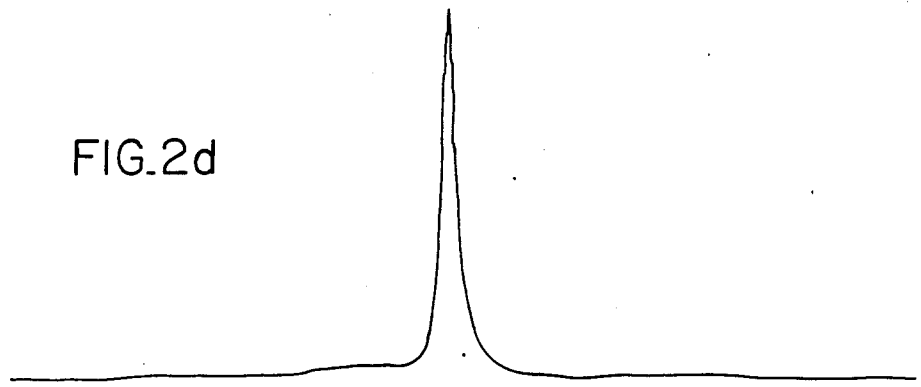

A further embodiment of the invention is shown in FIG. 3a. The helium fill/vent tube 30 communicates with constant pressure valve 32 and is vented therethrough to atmosphere. Constant pressure valve 32 is most easily realized through valve apparatus referenced to vacuum or to a thermally stable spring. Regulatory valves for maintaining constant pressure are known. In another embodiment (FIG. 3b) a signal is derived from pressure sensor 34 and compared with a reference in comparator 36 yielding an error signal. The error signal actuates an adjustable valve 38 through which the helium reservoir vents to atmosphere. A motor-driven needle valve for a piezoelectric valve is suitable for this purpose.

The implementation of the present invention is especially important when a lengthy experiment or set of correlated experiments is undertaken. Changes in barometric pressure due to weather fronts will then be isolated from the pressure in the cryogen reservoir and the deleterious effect shown in FIG(s). 2 may be avoided.

Since many changes can be made in the above construction and many apparently widely different embodiments of this invention could be made without departing from the scope thereof, it is intended that all matter contained in the above description are shown in the accompanying drawings shall be interpreted as illustrative and not in a limiting sense.

What is claimed is:

1. NMR apparatus comprising:

cryogenic-cooled magnet means for establishing a controlled magnetic field;

RF excitation means to excite nuclear magnetic resonance in a sample subject to said magnetic field;

detection means to detect a nuclear resonance signal from said sample;

said cryogenic-cooled magnet means further comprising:

a cryostat for maintaining a cryogen therewithin;

vent means for exhausting cryogen vapor therefrom; and constant pressure means for maintaining the pressure of cryogen vapor within said cryostat at a selected value.

2. The NMR apparatus of claim 1 wherein said constant pressure means comprises a differential pressure valve referenced to vacuum.

3. The NMR apparatus of claim 1 wherein said constant pressure means comprises a differential pressure valve referenced to a substantially thermally isolated spring.

4. The NMR apparatus of claim 1 wherein said constant pressure means comprises sensing means for ascertaining the pressure of said cryogen vapor and developing a pressure signal, comparator means for comparing said pressure signal to a reference whereby an error signal is generated and valve means cooperating with said vent means and responsive to said error signal to increase or decrease the gas flow impedance of said vent means.

* * * * *